(12) United States Patent
Shiota

(10) Patent No.: US 7,514,151 B2
(45) Date of Patent: Apr. 7, 2009

(54) INSULATING FILM AND METHOD FOR FORMING THE SAME, AND FILM-FORMING COMPOSITION

(75) Inventor: Atsushi Shiota, Sunnyvale, CA (US)

(73) Assignee: JSR Corporation, Tokyo (JP)

( * ) Notice: Subject to any disclaimer, the term of this patent is extended or adjusted under 35 U.S.C. 154(b) by 512 days.

(21) Appl. No.: 11/432,345

(22) Filed: May 12, 2006

(65) Prior Publication Data

US 2006/0275614 A1    Dec. 7, 2006

Related U.S. Application Data

(63) Continuation of application No. PCT/JP2004/018311, filed on Dec. 8, 2004.

(30) Foreign Application Priority Data

Dec. 9, 2003    (JP)    ............................. 2003-410203

(51) Int. Cl.
    *B32B 25/20*    (2006.01)
(52) U.S. Cl. .................. 428/447; 427/387; 528/35; 528/39
(58) Field of Classification Search ................ 428/447; 427/387; 528/35, 39
    See application file for complete search history.

(56) References Cited

U.S. PATENT DOCUMENTS

| | | | |
|---|---|---|---|
| 6,780,498 B2 | 8/2004 | Nakata et al. | |
| 6,809,041 B2 | 10/2004 | Interrante et al. | |
| 2001/0033026 A1 | 10/2001 | Nakata et al. | |
| 2003/0089903 A1* | 5/2003 | Nakata et al. | ............... 257/40 |
| 2004/0110379 A1* | 6/2004 | Yoshioka et al. | ............ 438/691 |
| 2005/0096415 A1 | 5/2005 | Akiyama et al. | |
| 2006/0006541 A1 | 1/2006 | Tsuchiya et al. | |
| 2006/0024980 A1 | 2/2006 | Tsuchiya et al. | |
| 2006/0275614 A1 | 12/2006 | Shiota | |

FOREIGN PATENT DOCUMENTS

| | | |
|---|---|---|
| JP | 2001-345317 | 12/2001 |
| JP | 2002-284998 | 10/2002 |
| JP | 2003-142477 | 5/2003 |
| JP | 2003-273100 | 9/2003 |
| JP | 2004-158606 | 6/2004 |

OTHER PUBLICATIONS

U.S. Appl. No. 11/596,295, filed Nov. 13, 2006, Akiyama, et al.
U.S. Appl. No. 11/596,188, filed Nov. 13, 2006, Akiyama, et al.
"Starfire® SP-DEPCS", Starfire® Systems, www.starfiresystems.com, May 2005, p. 1.
"Starfire® SP-DMPCS", Starfire® Systems, www.starfiresystems.com, May 2005, p. 1.
"Specialty Chemicals", Starfire Systems, (1), p. 1, date unknown.
"Specialty Chemicals", Starfire Systems, (2), p. 1, date unknown.
"Internet Archive WayBack Machine", http://web.archive.org/web/*/http://www.starfiresystems.com, p. 1, Mar. 2007.
"Starfire Systems: Projects, Specialty Chemicals", http://web.archive.org/web/20011205120755/www.starfiresystems.com/projects/chemicals.html, p. 1-2, Mar. 2007.
U.S. Appl. No. 12/278,224, filed Aug. 4, 2008, Nakagawa, et al.
U.S. Appl. No. 11/432,345, filed May 12, 2006, Shiota.
U.S. Appl. No. 11/484,604, filed Jul. 12, 2006, Nakagawa, et al.
U.S. Appl. No. 11/485,508, filed Jul. 13, 2006, Nakagawa, et al.
U.S. Appl. No. 11/486,085, filed Jul. 14, 2006, Nakagawa, et al.
U.S. Appl. No. 11/489,468, filed Jul. 20, 2006, Akiyama, et al.
U.S. Appl. No. 11/580,959, filed Oct. 16, 2006, Akiyama, et al.

* cited by examiner

*Primary Examiner*—Kuo-Liang Peng
(74) *Attorney, Agent, or Firm*—Oblon, Spivak, McClelland, Maier & Neustadt, P.C.

(57) ABSTRACT

A method of forming an insulating film includes: forming a polysiloxane insulating film on a substrate; forming a polycarbosilane insulating film on the polysiloxane insulating film; and forming a CVD insulating film on the polycarbosilane insulating film by plasma chemical vapor deposition (CVD). The polysiloxane insulating film is formed by hydrolysis and condensation of a silane compound, and the polycarbosilane insulating film is formed by applying a solution obtained by dissolving a polycarbosilane compound in a solvent, and heating the resulting coating.

5 Claims, No Drawings

INSULATING FILM AND METHOD FOR FORMING THE SAME, AND FILM-FORMING COMPOSITION

CROSS REFERENCE TO RELATED APPLICATION

This application is a continuation of International Patent Application No. PCT/JP2004/018311, having an international filing date of Dec. 8, 2004, which designated the United States, the entirety of which is incorporated herein by reference. Japanese Patent Application No. 2003-410203, filed on Dec. 9, 2003, is also incorporated herein by reference in its entirety.

BACKGROUND OF THE INVENTION

The present invention relates to a method of forming an insulating film. More particularly, the invention relates to an insulating film suitably used as an interlayer dielectric for a semiconductor device or the like, a method of forming the same, and a film-forming composition.

A silica ($SiO_2$) film formed by a vacuum process such as a chemical vapor deposition (CVD) method has been widely used as an interlayer dielectric for a semiconductor device or the like.

In recent years, in order to form an interlayer dielectric having a more uniform thickness, a spin-on-glass (SOG) film, which is a coating-type insulating film containing a tetraalkoxysilane hydrolysate as the major component, has also been used. Along with an increase in the degree of integration of a semiconductor device, a low-relative-dielectric-constant interlayer dielectric called an organic SOG containing a polyorganopolysiloxane as the major component has been developed.

However, more excellent electrical insulation between conductors has been demanded accompanying a further increase in the degree of integration and multilayering of a semiconductor device. Therefore, an interlayer dielectric having an excellent storage stability and a lower relative dielectric constant (low-k) and exhibiting superior leakage current characteristics has been in demand.

When forming an Si-containing film, such as $SiO_2$, SiN, SiC, SiCN, or SiOC, on a low-k insulating film represented by a polysiloxane insulating film by using a plasma CVD method, the low-k insulating film may be damaged due to plasma generated during deposition. If the insulating film is damaged, the relative dielectric constant of the insulating film is increased, or the insulating film exhibits decreased resistance against processing such as etching, ashing, or wet cleaning.

SUMMARY

The invention may provide a method of forming an insulating film capable of forming an insulating film which may be suitably used for a semiconductor device, for which an increase in the degree of integration and multilayering has been demanded, has a low relative dielectric constant, and exhibits excellent resistance against processing such as etching, ashing, or wet cleaning, and an insulating film formed by using the method.

The invention may also provide a film-forming composition which may be suitably used for the method of forming an insulating film.

A method of forming an insulating film according to a first aspect of the invention comprises:

forming a polysiloxane insulating film on a substrate;

forming a polycarbosilane insulating film on the polysiloxane insulating film; and forming a CVD insulating film on the polycarbosilane insulating film by plasma chemical vapor deposition (CVD);

wherein the polysiloxane insulating film is formed by hydrolysis and condensation of at least one silane compound selected from the group consisting of compounds shown by the following general formulas (1) to (3),

wherein R represents a hydrogen atom, a fluorine atom, or a monovalent organic group, $R^1$ represents a monovalent organic group, and a represents 1 or 2,

wherein $R^2$ represents a monovalent organic group,

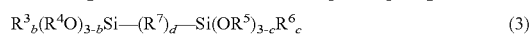

wherein $R^3$ to $R^6$ individually represent monovalent organic groups, b and c individually represent integers from 0 to 2, $R^7$ represents an oxygen atom, a phenylene group, or a group $-(CH_2)_m-$ (wherein m represents an integer from 1 to 6), and d represents 0 or 1; and wherein the polycarbosilane insulating film is formed by applying a solution obtained by dissolving a polycarbosilane compound shown by the following general formula (4) in a solvent, and heating the resulting coating,

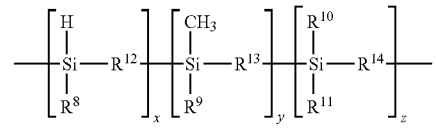

wherein $R^8$ to $R^{11}$ individually represent a hydrogen atom, a halogen atom, a hydroxyl group, alkoxyl group, sulfone group, methanesulfone group, trifluoromethanesulfone group, or monovalent organic group, $R^{12}$ to $R^{14}$ individually represent a substituted or unsubstituted alkylene group, alkenyl group, alkynyl group, or arylene group, and x, y, and z represent integers from 0 to 10,000, provided that x, y, and z satisfy a condition of "10<x+y+z<10,000".

With this method of forming an insulating film, in the formation step of the polycarbosilane insulating film, the coating may be heated at 80° C. or higher.

With this method of forming an insulating film, the CVD insulating film may be an Si-containing film such as $SiO_2$, SiN, SiC, SiCN, or SiOC.

An insulating film according to a second aspect of the invention comprises:

a polysiloxane insulating film formed on a substrate;

a polycarbosilane insulating film formed on the polysiloxane insulating film; and a CVD insulating film formed on the polycarbosilane insulating film by plasma CVD;

wherein the polysiloxane insulating film is formed by hydrolysis and condensation of at least one silane compound selected from the group consisting of compounds shown by the following general formulas (1) to (3),

wherein R represents a hydrogen atom, a fluorine atom, or a monovalent organic group, $R^1$ represents a monovalent organic group, and a represents 1 or 2, $$Si(OR^2)_4 \quad (2)$$

wherein $R^2$ represents a monovalent organic group, $$R^3{}_b(R^4O)_{3-b}Si\text{—}(R^7)_d\text{—}Si(OR^5)_{3-c}R^6{}_c \quad (3)$$

wherein $R^3$ to $R^6$ individually represent monovalent organic groups, b and c individually represent integers from 0 to 2, $R^7$ represents an oxygen atom, a phenylene group, or a group —$(CH_2)_m$— (wherein m represents an integer from 1 to 6), and d represents 0 or 1; and wherein the polycarbosilane insulating film is formed by applying a solution obtained by dissolving a polycarbosilane compound shown by the following general formula (4) in a solvent, and heating the resulting coating,

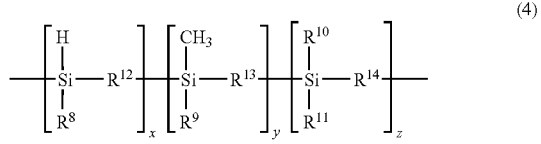

(4)

wherein $R^8$ to $R^{11}$ individually represent a hydrogen atom, a halogen atom, a hydroxyl group, alkoxyl group, sulfone group, methanesulfone group, trifluoromethanesulfone group, or monovalent organic group, $R^{12}$ to $R^{14}$ individually represent a substituted or unsubstituted alkylene group, alkenyl group, alkynyl group, or arylene group, and x, y, and z represent integers from 0 to 10,000, provided that x, y, and z satisfy a condition of "10<x+y+z<10,000".

With this insulating film, the CVD insulating film may be an Si-containing film such as $SiO_2$, SiN, SiC, SiCN, or SiOC.

According to a method of forming the above insulating film, since the polycarbosilane insulating film is formed after forming the polysiloxane insulating film (low-k film), the polysiloxane insulating film is not directly affected by plasma when forming the CVD insulating film by using the plasma CVD method, whereby the polysiloxane insulating film is prevented from being damaged. The polycarbosilane insulating film provided between the polysiloxane insulating film and the CVD insulating film is rarely damaged even when exposed to plasma so that the insulating properties and mechanical strength are affected to only a small extent. Therefore, according to the method of forming an insulating film according to the invention, an insulating film which exhibits excellent resistance against processing such as etching, ashing, or wet cleaning can be formed while maintaining the low relative dielectric constant of the polysiloxane insulating film. It suffices that the insulating film according to the invention include the polysiloxane insulating film, the polycarbosilane insulating film, and the CVD insulating film. The insulating film of the invention may further include another insulating film.

Since this insulating film has a low relative dielectric constant and exhibits excellent process resistance, the insulating film of the invention may be suitably used as an interlayer dielectric or a protective film for a semiconductor device, for example.

DETAILED DESCRIPTION OF THE EMBODIMENT

Embodiments of the method of forming an insulating film, the insulating film, and the film-forming composition according to the invention are described below in more detail.

The method of forming an insulating film according to the invention includes forming a polysiloxane insulating film on a substrate, forming a polycarbosilane insulating film on the polysiloxane insulating film, and forming a CVD insulating film on the polycarbosilane insulating film by plasma CVD. The "coating" used in the invention means a film obtained by applying a film-forming composition to a substrate and removing an organic solvent.

1. Method of Forming Polysiloxane Insulating Film 1.1. Component for Forming Polysiloxane Insulating Film (Component (A))

In the method of forming an insulating film of the invention, the component (A) is a polysiloxane compound obtained by hydrolysis and condensation of at least one silane compound selected from the group consisting of compounds shown by the following formula (1) (hereinafter called "compound 1"), compounds shown by the following formula (2) (hereinafter called "compound 2"), and compounds shown by the following formula (3) (hereinafter called "compound 3"). In the following description, the component (A) also includes the polysiloxane compound dissolved or dispersed in an organic solvent.

$$R_aSi(OR^1)_{4-a} \quad (1)$$

wherein R represents a hydrogen atom, a fluorine atom, or a monovalent organic group, $R^1$ represents a monovalent organic group, and a represents 1 or 2, $$Si(OR^2)_4 \quad (2)$$

wherein $R^2$ represents a monovalent organic group, $$R^3{}_b(R^4O)_{3-b}Si\text{—}(R^7)_d\text{—}Si(OR^5)_{3-c}R^6{}_c \quad (3)$$

wherein $R^3$ to $R^6$ individually represent monovalent organic groups, b and c individually represent integers from 0 to 2, $R^7$ represents an oxygen atom, a phenylene group, or a group —$(CH_2)_m$— (wherein m represents an integer from 1 to 6), and d represents 0 or 1.

1.1.1 Compound 1

In the general formula (1), as examples of the monovalent organic group represented by R and $R^1$, an alkyl group, aryl group, allyl group, glycidyl group, and the like can be given. It is preferable that the monovalent organic group represented by $R^1$ in the general formula (1) be an alkyl group or a phenyl group. As examples of the alkyl group, a methyl group, ethyl group, propyl group, butyl group, and the like can be given. The alkyl group preferably includes 1 to 5 carbon atoms. The alkyl group may be either linear or branched. A hydrogen atom in the alkyl group may be replaced by a fluorine atom or the like. As examples of the aryl group in the general formula (1), a phenyl group, naphthyl group, methylphenyl group, ethylphenyl group, chlorophenyl group, bromophenyl group, fluorophenyl group, and the like can be given.

As specific examples of the compound 1, methyltrimethoxysilane, methyltriethoxysilane, methyltri-n-propoxysilane, methyltriisopropoxysilane, methyltri-n-butoxysilane, methyltri-sec-butoxysilane, methyltri-tert-butoxysilane, methyltripherioxysilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-tert-butoxysilane, ethyltriphenoxysilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-tertbutoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-tert-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-tert-butoxysilane, n-butyltriphenoxysilane, sec-butyltrimethoxysilane, sec-butylisotriethoxysilane, sec-butyltri-n-propoxysilane, sec-butyltriisopropoxysilane, sec-butyltri-n-butoxysilane, sec-butyltri-sec-butoxysilane, sec-butyltri-tert-butoxysilane, sec-butyltriphenoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltri-sec-butoxysilane, tert-butyltri-tert-butoxysilane, tert-butyltriphenoxysilane, phenyltrimethoxysilane, phenyltriethoxysilane, phenyltri-n-propoxysilane, phenyltriisopropoxysilane, phenyltri-n-butoxysilane, phenyltri-sec-butoxysilane, phenyltri-tert-butoxysilane, phenyltriphenoxysilane, dimethyldimethoxysilane, dimethyldiethoxysilane, dimethyldi-n-propoxysilane, dimethyldiisopropoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldiisopropoxysilane, diethyldi-n-butoxysilane, diethyldi-sec-butoxysilane, diethyldi-tert-butoxysilane, diethyldiphenoxysilane, di-n-propyldimethoxysilane, di-n-propyldiethoxysilane, di-n-propyldi-n-propoxysilane, di-n-propyldiisopropoxysilane, di-n-propyldi-n-butoxysilane, di-n-propyldi-sec-butoxysilane, di-n-propyldi-tert-butoxysilane, di-n-propyldi-phenoxysilane, diisopropyldimethoxysilane, diisopropyldiethoxysilane, diisopropyldi-n-propoxysilane, diisopropyldiisopropoxysilane, diisopropyldi-n-butoxysilane, diisopropyldi-sec-butoxysilane, diisopropyldi-tert-butoxysilane, diisopropyldiphenoxysilane, di-n-butyldimethoxysilane, di-n-butyldiethoxysilane, di-n-butyldi-n-propoxysilane, di-n-butyldiisopropoxysilane, di-n-butyldi-n-butoxysilane, di-n-butyldi-sec-butoxysilane, di-n-butyldi-tert-butoxysilane, di-n-butyldiphenoxysilane, di-sec-butyldimethoxysilane, di-sec-butyldiethoxysilane, di-sec-butyldi-n-propoxysilane, di-sec-butyldiisopropoxysilane, di-sec-butyldi-n-butoxysilane, di-sec-butyldi-sec-butoxysilane, di-sec-butyldi-tert-butoxysilane, di-sec-butyldi-phenoxysilane, di-tert-butyldimethoxysilane, di-tert-butyldiethoxysilane, di-tert-butyldi-n-propoxysilane, di-tert-butyldiisopropoxysilane, di-tert-butyldi-n-butoxysilane, di-tert-butyldi-sec-butoxysilane, di-tert-butyldi-tert-butoxysilane, di-tert-butyldi-phenoxysilane, diphenyldimethoxysilane, diphenyldiethoxysilane, diphenyldi-n-propoxysilane, diphenyldiisopropoxysilane, diphenyldi-n-butoxysilane, diphenyldi-sec-butoxysilane, diphenyldi-tert-butoxysilane, diphenyldiphenoxysilane, divinyltrimethoxysilane, γ-aminopropyltrimethoxysilane, γ-aminopropyltriethoxysilane, γ-glycidoxypropyltrimethoxysilane, γ-glycidoxypropyltriethoxysilane, γ-trifluoropropyltrimethoxysilane, γ-trifluoropropyltriethoxysilane, and the like can be given. These compounds may be used either individually or in combination of two or more.

Of these, tetramethoxysilane, tetraethoxysilane, tetra-n-propoxysilane, tetraisopropoxysilane, tetraphenoxysilane, methyltrimethoxysilane, methyltriethoxysilane, methyltri-n-propoxysilane, methyltriisopropoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, diphenyldiethoxysilane, tetramethoxysilane, tetramethoxysilane, tetraethoxysilane, tetra-n-propoxysilane, tetraisopropoxysilane, tetra-n-butoxysilane, tetra-sec-butoxysilane, tetra-tert-butoxysilane, tetraphenoxysilane, and the like are particularly preferable as the compound 1.

1.1.2 Compound 2

In the general formula (2), as examples of the monovalent organic group represented by $R^2$, the organic groups given as examples for the general formula (1) can be given.

As specific examples of the compound 2, tetramethoxysilane, tetraethoxysilane, tetra-n-propoxysilane, tetra-isopropoxysilane, tetra-n-butoxysilane, tetra-sec-butoxysilane, tetra-tert-butoxysilane, tetraphenoxysilane, and the like can be given. Of these, tetramethoxysilane and tetraethoxysilane are particularly preferable. These compounds may be used either individually or in combination of two or more.

1.1.3 Compound 3

As examples of the compounds shown by the general formula (3) in which d is 0, hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldisilane, 1,1,2,2-tetraethoxy-1,2-diphenyldisilane, 1,1,2,2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,1,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, 1,2-diphenoxy-1,1,2,2-tetraphenyldisilane, and the like can be given.

Of these, hexamethoxydisilane, hexaethoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, 1,2-diethoxy-1,1,2,2-tetraphenyldisilane, and the like are preferable.

As examples of the compounds shown by the general formula (3) in which $R^7$ represents the group —$(CH_2)_m$—, bis(trimethoxysilyl)methane, bis(triethoxysilyl)methane, bis(tri-n-propoxysilyl)methane, bis(triisopropoxysilyl)methane, bis(tri-n-butoxysilyl)methane, bis(tri-sec-butoxysilyl)methane, bis(tri-tert-butoxysilyl)methane, 1,2-bis(trimethoxysilyl)ethane, 1,2-bis(triethoxysilyl)ethane, 1,2-bis(tri-n-propoxysilyl)ethane, 1,2-bis(triisopropoxysilyl)ethane, 1,2-bis(tri-n-butoxysilyl)ethane, 1,2-bis(tri-sec-butoxysilyl)ethane, 1,2-bis(tri-tert-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethylsilyl)-1-(tri-n-propoxysilyl)methane, 1-(diisopropoxymethylsilyl)-1-(triisopropoxysilyl)methane, 1-(di-n-butoxymethylsilyl)-1-(tri-n-butoxysilyl)methane, 1-(di-sec-butoxymethylsilyl)-1-(tri-sec-butoxysilyl)methane, 1-(di-tert-butoxymethylsilyl)-1-(tri-tert-butoxysilyl)methane, 1-(dimethoxymethylsilyl)-2-(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(diisopropoxymethylsilyl)-2-(triisopropoxysilyl)ethane, 1-(di-n-butoxymethylsilyl)-2-(tri-n-butoxysilyl)ethane, 1-(di-sec-butoxymethylsilyl)-2-(tri-sec-butoxysilyl)ethane, 1-(di-tert-butoxymethylsilyl)-2-(tri-tert-butoxysilyl)ethane, bis(dimethoxymethylsilyl)methane, bis(diethoxymethylsilyl)methane, bis(di-n-propoxymethylsilyl)methane, bis(diisopropoxymethylsilyl)methane, bis(di-n-butoxymethylsilyl)methane, bis(di-sec-butoxymethylsilyl)methane, bis(di-tert-butoxymethylsilyl)methane, 1,2-bis(dimethoxymethylsilyl)ethane, 1,2-bis(diethoxymethylsilyl)ethane, 1,2-bis(di-n-propoxymethylsilyl)ethane, 1,2-bis(diisopropoxymethylsilyl)ethane, 1,2-bis(di-n-butoxymethylsilyl)ethane, 1,2-bis(di-sec-butoxymethylsilyl)ethane, 1,2-bis(di-tert-butoxymethylsilyl)ethane, 1,2-bis(trimethoxysilyl)benzene, 1,2-bis(triethoxysilyl)benzene, 1,2-bis(tri-n-propoxysilyl)benzene, 1,2-bis(triisopropoxysilyl)benzene, 1,2-bis(tri-n-butoxysilyl)benzene, 1,2-bis(tri-sec-butoxysilyl)benzene, 1,2-bis(tri-tert-butoxysilyl)benzene, 1,3-bis(trimethoxysilyl)benzene, 1,3-bis(triethoxysilyl)benzene, 1,3-bis(tri-n-propoxysilyl)benzene, 1,3-bis(triisopropoxysilyl)benzene, 1,3-bis(tri-n-butoxysilyl)benzene, 1,3-bis(tri-sec-butoxysilyl)benzene, 1,3-bis(tri-tert-butoxysilyl)benzene, 1,4-bis(trimethoxysilyl)benzene, 1,4-bis(triethoxysilyl)benzene, 1,4-bis(tri-n-propoxysilyl)benzene, 1,4-bis(triisopropoxysilyl)benzene, 1,4-bis(tri-n-butoxysilyl)benzene, 1,4-bis(tri-sec-butoxysilyl)benzene, 1,4-bis(tri-tert-butoxysilyl)benzene, and the like can be given.

Of these, bis(trimethoxysilyl)methane, bis(triethoxysilyl)methane, 1,2-bis(trimethoxysilyl)ethane, 1,2-bis(triethoxysilyl)ethane, 1-(dimethoxymethylsilyl)-1-(trimethoxysilyl)methane, 1-(diethoxymethylsilyl)-1-(triethoxysilyl)methane, 1-(dimethoxymethylsilyl)-2-(trimethoxysilyl)ethane, 1-(diethoxymethylsilyl)-2-(triethoxysilyl)ethane, bis(dimethoxymethylsilyl)methane, bis(diethoxymethylsilyl)methane, 1,2-bis(dimethoxymethylsilyl)ethane, 1,2-bis(diethoxymethylsilyl)ethane, 1,2-bis(trimethoxysilyl)benzene, 1,2-bis(triethoxysilyl)benzene, 1,3-bis(trimethoxysilyl)benzene, 1,3-bis(triethoxysilyl)benzene, 1,4-bis(trimethoxysilyl)benzene, 1,4-bis(triethoxysilyl)benzene, and the like are preferable.

The compounds 1 to 3 may be used either individually or in combination of two or more.

When subjecting the compounds 1 to 3 to hydrolysis and partial condensation, it is preferable to use water in an amount of 0.3 to 10 mol for one mol of the groups represented by $R^1O-$, $R^2O-$, $R^4O-$, and $R^5O-$ in the general formulas (1) to (3). When the siloxane compound is a condensation product, the siloxane compound preferably has a polystyrene-reduced weight average molecular weight of 500 to 10,000. A complete hydrolysis-condensation product used in the invention refers to a product in which the groups represented by $R^1O-$, $R^2O-$, $R^4O-$, and $R^5O-$ in the siloxane compound are entirely hydrolyzed to form OH groups and the resulting silanol groups are completely condensed.

1.1.4. Catalyst

In the method of forming an insulating film of the invention, a catalyst may be included in the component (A), if necessary. As the catalyst, it is preferable to use a specific basic compound.

A polysiloxane insulating film having a low relative dielectric constant and a high modulus of elasticity and exhibiting excellent adhesion to a substrate can be obtained by using the specific basic compound. As examples of the specific basic compound, tetraalkylammonium hydroxides such as tetramethylammonium hydroxide, tetraethylammonium hydroxide, tetrapropylammonium hydroxide, and tetrabutylammonium hydroxide, alicyclic organic amines such as piperidine, 1-methylpiperidine, 2-methylpiperidine, 3-methylpiperidine, 4-methylpiperidine, piperazine, 1-methylpiperazine, 2-methylpiperazine, 1,4-dimethylpiperazine, pyrrolidine, 1-methylpyrrolidine, diazabicyclooctane, diazabicyclononane, diazabicycloundecene, 2-pyrazoline, 3-pyrroline, and quinuclidine, and metal hydroxides such as sodium hydroxide, potassium hydroxide, lithium hydroxide, and cesium hydroxide can be given. Of these, tetramethylammonium hydroxide, tetraethylammonium hydroxide, tetrapropylammonium hydroxide, tetrabutylammonium hydroxide, piperidine, 1-methylpiperidine, piperazine, 1-methylpiperazine, 1,4-dimethylpiperazine, pyrrolidine, 1-methylpyrrolidine, diazabicyclooctane, diazabicyclononane, diazabicycloundecene, sodium hydroxide, potassium hydroxide, and lithium hydroxide are particularly preferable from the viewpoint of the adhesion of the silica-based film to a substrate. The specific basic compound may be used either individually or in combination of two or more.

The amount of the specific basic compound to be used is usually 0.00001 to 10 mol, preferably 0.00005 to 5 mol, particularly preferably 0.001 to 5 mol, and still more preferably 0.01 to 0.5 mol for one mol of the total amount of the groups represented by the $R^1O-$ group, $R^2O-$ group, $R^4O-$ group, and $R^5O-$ group in the compounds 1 to 3. If the amount of the specific basic compound used is within the above range, polymer precipitation or gelation rarely occurs during the reaction.

The following organic acid, inorganic acid, organic base, inorganic base, and metal chelate can also be given as examples of the catalyst. Some of the catalysts given below overlap the above-mentioned specific basic compound.

As examples of the organic acid, acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, and the like can be given.

As examples of the inorganic acid, hydrochloric acid, nitric acid, sulfuric acid, hydrofluoric acid, phosphoric acid, and the like can be given. As examples of the inorganic base, ammonia, sodium hydroxide, potassium hydroxide, barium hydroxide, calcium hydroxide, and the like can be given.

As examples of the organic base, methanolamine, ethanolamine, propanolamine, butanolamine, N-methylmethanolamine, N-ethylmethanolamine, N-propylmethanolamine, N-butylmethanolamine, N-methylethanolamine, N-ethylethanolamine, N-propylethanolamine, N-butylethanolamine, N-methylpropanolamine, N-ethylpropanolamine, N-propylpropanolamine, N-butylpropanolamine, N-methylbutanolamine, N-ethylbutanolamine, N-propylbutanolamine, N-butylbutanolamine, N,N-dimethylmethanolamine, N,N-diethylmethanolamine, N,N-dipropylmethanolamine, N,N-dibutylmetanolamine, N,N-dimethylethanolamine, N,N-diethylethanolamine, N,N-dipropylethanolamine, N,N-dibutylethanolamine, N,N-dimethylpropanolamine, N,N-diethylpropanolamine, N,N-dipropylpropanolamine, N,N-dibutylpropanolamine, N,N-dimethylbutanolamine, N,N-diethylbutanolamine, N,N-dipropylbutanolamine, N,N-dibutylbutanolamine, N-methyldimethanolamine, N-ethyldimethanolamine, N-propyldimethanolamine, N-butyldimethanolamine, N-methyldiethanoleamine, N-ethyldiethanolamine, N-propyldiethanolamine, N-butyldiethanolamine, N-methyldipropanolamine, N-ethyldipropanolamine, N-propyldipropanolamine, N-butyldipropanolamine, N-methyldibutanolamine, N-ethyldibutanolamine, N-propyldibutanolamine, N-butyldibutanolamine, N-(aminomethyl)methanolamine, N-(aminomethyl)ethanolamine, N-(aminomethyl)propanolamine, N-(aminomethyl)butanolamine, N-(aminoethyl)methanolamine, N-(aminoethyl)ethanolamine, N-(aminoethyl)propanolamine, N-(aminoethyl)butanolamine, N-(aminopropyl)methanolamine, N-(aminopropyl)ethanolamine, N-(aminopropyl)propanolamine, N-(aminopropyl)butanolamine, N-(aminobutyl)methanolamine, N-(aminobutyl)ethanolamine, N-(aminobutyl)propanolamine, N-(aminobutyl)butanolamine, methoxymethylamine, methoxyethylamine, methoxypropylamine, methoxybutylamine, ethoxymethylamine, ethoxyethylamine, ethoxypropylamine, ethoxybutylamine, propoxymethylamine, propoxyethylamine, propoxypropylamine, propoxybutylamine, butoxymethylamine, butoxyethylamine, butoxypropylamine, butoxybutylamine, methylamine, ethylamine, propylamine, butylamine, N,N-dimethylamine, N,N-diethylamine, N,N-dipropylamine, N,N-dibutylamine, trimethylamine, triethylamine, tripropylamine, tributylamine, tetramethylammonium hydroxide, tetraethylammonium hydroxide, tetrapropylammonium hydroxide, tetrabutylammonium hydroxide, tetramethylethylenediamine, tetraethylethylenediamine, tetrapropylethylenediamine, tetrabutylethylenediamine, methylaminomethylamine, methylaminoethylamine, methylaminopropylamine, methylaminobutylamine, ethylaminomethylamine, ethylaminoethylamine, ethylaminopropylamine, ethylaminobutylamine, propylaminomethylamine, propylaminoethylamine, propylaminopropylamine, propylaminobutylamine, butylaminomethylamine, butylaminoethylamine, butylaminopropylamine, butylaminobutylamine, pyridine, pyrrole, piperazine, pyrrolidine, piperidine, picoline, morpholine, methylmorpholine, diazabicyclooctane, diazabicyclononane, diazabicycloundecene, and the like can be given.

As examples of the metal chelate, titanium chelate compounds such as triethoxy.mono(acetylacetonato)titanium, tri-n-propoxy.mono(acetylacetonato)titanium, triisopropoxy.mono(acetylacetonato)titanium, tri-n-butoxy.mono(acetylacetonato)titanium, tri-sec-butoxy.mono(acetylacetonato)titanium, tri-tert-butoxy.mono(acetylacetonato)titanium, diethoxy.bis(acetylacetonato)titanium, di-n-propoxy.bis(acetylacetonato)titanium, diisopropoxy.bis(acetylacetonato)titanium, di-n-butoxy.bis(acetylacetonato)titanium, di-sec-butoxy.bis(acetylacetonato)titanium, di-tert-butoxy.bis(acetylacetonato)titanium, monoethoxy.tris(acetylacetonato)titanium, mono-n-propoxy.tris(acetylacetonato)titanium, monoisopropoxy.tris(acetylacetonato)titanium, mono-n-butoxy.tris(acetylacetonato)titanium, mono-sec-butoxy.tris(acetylacetonato) titanium, mono-tert-butoxy.tris(acetylacetonato)titanium, tetrakis(acetylacetonato)titanium, triethoxy.mono(ethylacetoacetate)titanium, tri-n-propoxy.mono(ethylacetoacetate)titanium, triisopropoxy.mono(ethylacetoacetate)titanium, tri-n-butoxy.mono(ethylacetoacetate)titanium, tri-sec-butoxy.mono(ethylacetoacetate)titanium, tri-tert-butoxy.mono(ethylacetoacetate)titanium, diethoxy.bis(ethylacetoacetate)titanium, di-n-propoxy.bis(ethylacetoacetate)titanium, diisopropoxy.bis(ethylacetoacetate)titanium, di-n-butoxy.bis(ethylacetoacetate)titanium, di-sec-butoxy.bis(ethylacetoacetate)titanium, di-tert-butoxy.bis(ethylacetoacetate)titanium, monoethoxy.tris(ethylacetoacetate)titanium, mono-n-propoxy.tris(ethylacetoacetate)titanium, monoisopropoxy.tris(ethylacetoacetate)titanium, mono-n-butoxy.tris(ethylacetoacetate)titanium, mono-sec-butoxy.tris(ethylacetoacetate)titanium, mono-tert-butoxy.tris(ethylacetoacetate)titanium, tetrakis(ethylacetoacetate)titanium, mono(acetylacetonato)tris(ethylacetoacetate)titanium, bis(acetylacetonato)bis(ethylacetoacetate)titanium, and tris(acetylacetonato)mono(ethylacetoacetate)titanium; zirconium chelate compounds such as triethoxy.mono(acetylacetonato)zirconium, tri-n-propoxy.mono(acetylacetonato)zirconium, triisopropoxy.mono(acetylacetonato)zirconium, tri-n-butoxy.mono(acetylacetonato)zirconium, tri-sec-butoxy.mono(acetylacetonato)zirconium, tri-tert-butoxy.mono(acetylacetonato)zirconium, diethoxy.bis(acetylacetonato)zirconium, di-n-propoxy.bis(acetylacetonato)zirconium, diisopropoxy.bis(acetylacetonato)zirconium, di-n-butoxy.bis(acetylacetonato)zirconium, di-sec-butoxy.bis(acetylacetonato)zirconium, di-tert-butoxy.bis(acetylacetonato)zirconium, monoethoxy.tris(acetylacetonato)zirconium, mono-n-propoxy.tris(acetylacetonato)zirconium, monoisopropoxy.tris(acetylacetonato)zirconium, mono-n-butoxy.tris(acetylacetonato)zirconium, mono-sec-butoxy.tris(acetylacetonato)zirconium, mono-tert-butoxy.tris(acetylacetonato)zirconium, tetrakis(acetylacetonato)zirconium, triethoxy.mono(ethylacetoacetate)zirconium, tri-n-propoxy.mono(ethylacetoacetate)zirconium, triisopropoxy.mono(ethylacetoacetate)zirconium, tri-n-butoxy.mono(ethylacetoacetate)zirconium, tri-sec-butoxy.mono(ethylacetoacetate)zirconium, tri-tert-butoxy.mono(ethylacetoacetate)zirconium, diethoxy.bis(ethylacetoacetate)zirconium, di-n-propoxy.bis(ethylacetoacetate)zirconium, diisopropoxy.bis(ethylacetoacetate)zirconium, di-n-butoxy.bis(ethylacetoacetate)zirconium, di-sec-butoxy.bis(ethylacetoacetate)zirconium, di-tert-butoxy.bis(ethylacetoacetate)zirconium, monoethoxy.tris(ethylacetoacetate)zirconium, mono-n-propoxy.tris(ethylacetoacetate)zirconium, monoisopropoxy.tris(ethylacetoacetate)zirconium, mono-n-butoxy.tris(ethylacetoacetate)zirconium, mono-sec-butoxy.tris(ethylacetoacetate)zirconium, mono-tert-butoxy.tris(ethylacetoacetate)zirconium, tetrakis(ethylacetoacetate)zirconium, mono(acetylacetonato)tris(ethylacetoacetate)zirconium, bis(acetylacetonato)bis(ethylacetoacetate)zirconium, and tris(acetylacetonato)mono(ethylacetoacetate)zirconium; aluminum chelate compounds such as tris(acetylacetonato)aluminum and tris(ethylacetoacetate)aluminum; and the like can be given.

The catalyst is used in an amount of usually 0.0001 to 1 mol, and preferably 0.001 to 0.1 mol for one mol of the total amount of the compounds 1 to 3.

1.2 Method of Producing Film-forming Composition

In the method of producing a film-forming composition for forming the polysiloxane insulating film (hereinafter may be called "composition 1"), at least one silane compound selected from the compounds 1 to 3 is subjected to hydrolysis and condensation in the presence of the above-mentioned catalyst, water, and an organic solvent described later.

The hydrolysis and condensation is carried out usually at 20 to 180° C. for 10 min to 48 hours, and preferably at 30 to 150° C. for 10 min to 24 hours. The reaction is carried out in an open vessel or an airtight vessel usually at a pressure of about 0.05 to 3 MPa.

The total solid content of the composition 1 thus obtained may be appropriately adjusted according to the application, preferably in the range of 0.5 to 30 wt %. If the total solid content of the film-forming composition of the invention is 0.5 to 30 wt %, the resulting insulating film has a thickness within an appropriate range, and the composition exhibits a more excellent storage stability. The total solid content may be adjusted by concentration and dilution with an organic solvent, if necessary.

In the method of producing the composition 1, it is preferable to adjust the pH of the resulting composition to 7 or lower.

As the method for adjusting the pH, the following methods (I) to (V) can be given.

(I) Method of adding pH adjusting agent
(II) Method of evaporating tetraalkylammonium hydroxide from the composition under normal pressure or reduced pressure
(III) Method of removing tetraalkylammonium hydroxide from the composition by bubbling gas such as nitrogen or argon through the composition
(IV) Method of removing tetraalkylammonium hydroxide from the composition using ion-exchange resin
(V) Method of removing tetraalkylammonium hydroxide from the system by extraction or washing These methods may be used in combination.

As the pH adjusting agent which may be used in the method (I), an inorganic acid and an organic acid can be given.

As examples of the inorganic acid, hydrochloric acid, nitric acid, sulfuric acid, hydrofluoric acid, phosphoric acid, boric acid, oxalic acid, and the like can be given.

As examples of the organic acid, acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, succinic acid, itaconic acid, mesaconic acid, citraconic acid, malic acid, hydrolysate of glutaric acid, hydrolysate of maleic anhydride, hydrolysate of phthalic anhydride, and the like can be given.

These compounds may be used either individually or in combination of two or more.

The pH of the film-forming composition is adjusted to 7 or lower, and preferably 1 to 6. The storage stability of the resulting composition is improved by adjusting the pH within the above range using the pH adjusting agent.

The pH adjusting agent is used in such an amount that the pH of the composition falls within the above range. The amount of the pH adjusting agent to be used is appropriately selected.

1.2.1 Organic Solvent

The hydrolysis and condensation may be carried out in the presence of an organic solvent.

As the organic solvent, at least one solvent selected from the group consisting of alcohol solvents, ketone solvents, amide solvents, ester solvents, and nonprotonic solvents can be given.

Examples of the alcohol solvents include: monohydric alcohol solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, and diacetone alcohol; polyhydric alcohol solvents such as ethylene glycol, 1,2-propylene glycol, 1,3-butylene glycol, pentanediol-2,4,2-methylpentanediol-2,4, hexanediol-2,5, heptanediol-2,4, 2-ethylhexanediol-1,3, diethylene glycol, dipropylene glycol, triethylene glycol, and tripropylene glycol; polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, and dipropylene glycol monopropyl ether; and the like.

These alcohol solvents may be used either individually or in combination of two or more.

Examples of the ketone solvents include acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, diisobutyl ketone, trimethylenonane, cyclohexanone, methylcyclohexanone, 2,4-pentanedione, acetonylacetone, acetophenone, and fenchone, as well as β-diketones such as acetylacetone, 2,4-hexanedione, 2,4-heptanedione, 3,5-heptanedione, 2,4-octanedione, 3,5-octanedione, 2,4-nonanedione, 3,5-nonanedione, 5-methyl-2,4-hexanedione, 2,2,6,6-tetramethyl-3,5-heptanedione, 1,1,1,5,5,5-hexafluoro-2,4-heptanedione, and the like.

These ketone solvents may be used either individually or in combination of two or more.

Examples of the amide solvents include formamide, N-methylformamide, N,N-dimethylformamide, N-ethylformamide, N,N-diethylformamide, acetamide, N-methylacetamide, N,N-dimethylacetamide, N-ethylacetamide, N,N-diethylacetamide, N-methylpropioneamide, N-methylpyrrolidone, N-formylmorpholine, N-formylpiperidine, N-formylpyrrolidine, N-acetylmorpholine, N-acetylpiperidine, N-acetylpyrrolidine, and the like.

These amide solvents may be used either individually or in combination of two or more.

Examples of the ester solvents include diethyl carbonate, ethylene carbonate, propylene carbonate, diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like.

These ester solvents may be used either individually or in combination of two or more.

Examples of the nonprotonic solvents include acetonitrile, dimethylsulfoxide, N,N,N',N'-tetraethylsulfonamide, hexamethylphosphoric acid triamide, N-methylmorphorone, N-methylpyrrole, N-ethylpyrrole, N-methyl-Δ3-pyrroline, N-methylpiperidine, N-ethylpiperidine, N,N-dimethylpiperazine, N-methylimidazole, N-methyl-4-piperidone, N-methyl-2-piperidone, N-methyl-2-pyrrolidone, 1,3-dimethyl-2-imidazolidinone, 1,3-dimethyltetrahydro-2(1H)-pyrimidinone, and the like.

These nonprotonic solvents may be used either individually or in combination of two or more.

Of these organic solvents, the alcohol solvents are preferable. The organic solvents may be used either individually or in combination of two or more.

1.3 Method of Depositing Polysiloxane Insulating Film

The polysiloxane insulating film may be formed by applying the composition 1 to a substrate, removing the solvent, and curing the resulting coating by heating. As the method for applying the composition 1 to the substrate, a spin coating method, a dipping method, a roller blade method, and a spray method can be given. A coating with a dry thickness of 0.01 to 1.5 μm is obtained by single application, and a coating with a dry thickness of 0.02 to 3 μm is obtained by double application.

The coating may be dried by heating at about 60 to 600° C. for about 1 to 240 minutes, for example. As the heating method, a hot plate, oven, furnace, or the like may be used. The coating may be heated in air, in nitrogen, in argon, under vacuum, or under reduced pressure in which the oxygen concentration is controlled. The coating may also be formed by applying electron beams or ultraviolet rays. In this case, the drying time can be reduced.

2. Method of Forming Polysiloxane Insulating Film 2.1. Component for Forming Polycarbosilane Insulating Film (Component (B))

The component (B) is a polycarbosilane compound shown by the following general formula (4) (hereinafter may be called "compound 4"). In the following description, the component (B) also includes the polycarbosilane compound dissolved or dispersed in an organic solvent.

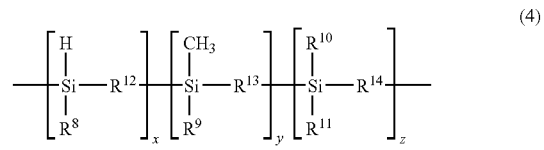

In the general formula (4), $R^8$ to $R^{11}$ represent a hydrogen atom, a hydroxyl group, alkoxyl group, sulfone group, methanesulfone group, trifluoromethanesulfone group, or monovalent organic group. As examples of the monovalent organic group, groups similar to the groups given as examples for the compound 1 can be given. $R^8$ to $R^{11}$ may be either the same groups or different groups.

$R^{12}$ to $R^{14}$ represent a substituted or unsubstituted alkylene group, alkenyl group, alkynyl group, or arylene group. $R^{12}$ to $R^{14}$ may be either the sane groups or different groups.

As examples of the alkylene group, a methylene group, ethylene group, trimethylene group, tetramethylene group, and the like can be given.

As examples of the alkenyl group, a vinylene group, a propenylene group, and the like can be given.

As examples of the alkynyl group, an ethynylene group and the like can be given.

As examples of the arylene group, a phenylene group, a naphthylene group, and the like can be given.

x, y, and z are integers from 0 to 10,000. It is preferable that x, y, and z be values which satisfy a condition of preferably "10<x+y+z<10,000", and still more preferably "20<x+y+z<5000". This range is optimum for preparing the film formation composition. When the relative dielectric constant of the polysiloxane insulating film is 2.5 or less, it is preferable that x+y+z be greater than 50. Since the polysiloxane insulating film having a relative dielectric constant of 2.5 or less is porous, the polycarbosilane enters the pores if x+y+z is smaller than 50.

As examples of the polycarbosilane compound, polyallylhydridocarbosilane, polydimethylcarbosilane, polydimethoxycarbosilane, polymethylhydridocarbosilane, polydihydrocarbosilane, and the like can be given.

2.2 Method of Producing Film-forming Composition

In the method of producing a film-forming composition for forming the polycarbosilane insulating film (hereinafter may be called "composition 2"), the film-forming composition is obtained by dissolving the compound 4 in a solvent.

The total solid content of the composition 2 thus obtained may be appropriately adjusted according to the application, preferably in the range of 0.1 to 25 wt %. If the total solid content of the composition is 2 is within the above range, the resulting insulating film has a thickness within an appropriate range, and the composition exhibits a more excellent storage stability. The total solid content may be adjusted by concentration and dilution with an organic solvent, if necessary. The composition 2 is preferably prepared so that the amount of the polycarbosilane compound is 0.1 to 20 wt % and the amount of the solvent is 80 to 99.9 wt %. This range of the amount of the polycarbosilane compound is optimum for preparing the film formation composition.

Additives such as a surfactant, a pH adjusting agent, and a leveling agent may be added to the composition 2, if necessary.

2.2.1 Organic Solvent

As an organic solvent for preparing the composition 2, ketone solvents, ester solvents, alcohol solvents, aromatic solvents, and the like can be given.

Examples of the ketone solvents include acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, diisobutyl ketone, trimethylenonane, cyclohexanone, methylcyclohexanone, 2,4-pentanedione, acetonyl acetone, acetophenone, and fenchone, β-diketones such as acetylacetone, 2,4-hexanedione, 2-heptanone, 2,4-heptanedione, 3,5-heptanedione, 2,4-octanedione, 3,5-octanedione, 2,4-nonanedione, 3,5-nonanedione, 5-methyl-2,4-hexanedione, 2,2,6,6-tetramethyl-3,5-heptanedione, and 1,1,1,5,5,5-hexafluoro-2,4-heptanedione, and the like.

Examples of the ester solvents include diethyl carbonate, ethylene carbonate, propylene carbonate, diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like.

Examples of the alcohol solvents include polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, and dipropylene glycol monopropyl ether, and the like.

Examples of the aromatic solvents include benzene, toluene, xylene, mesitylene, and the like.

2.2.2. Surfactant

As examples of the surfactant, a nonionic surfactant, an anionic surfactant, a cationic surfactant, an amphoteric surfactant, and the like can be given. As specific examples, a fluorine-containing surfactant, a silicone surfactant, a polyalkylene oxide surfactant, a poly(meth)acrylate surfactant, and the like can be given. Of these, the fluorine-containing surfactant and the silicone surfactant are preferable.

As examples of the fluorine-containing surfactant, compounds having a fluoroalkyl or fluoroalkylene group in at least one of the terminal, main chain, and side chain, such as 1,1,2,2-tetrafluorooctyl(1,1,2,2-tetrafluoropropyl)ether, 1,1,2,2-tetrafluorooctylhexyl ether, octaethylene glycol di(1,1,2,2-tetrafluorobutyl)ether, hexaethylene glycol (1,1,2,2,3,3-hexafluoropentyl)ether, octapropylene glycol di(1,1,2,2-tetrafluorobutyl)ether, hexapropylene glycol di(1,1,2,2,3,3-hexafluoropentyl) ether, sodium perfluorododecylsulfonate, 1,1,2,2,8,8,9,9,10,10-decafluorododecane, 1,1,2,2,3,3-hexafluorodecane, N-3-(perfluorooctanesulfonamide)-propyl-N,N'-dimethyl-N-carboxymethyleneammoni um betaine, perfluoroalkylsulfonamidepropyltrimethylammonium salt, perfluoroalkyl-N-ethylsulfonylglycine salt, bis(N-perfluorooctylsulfonyl-N-ethylaminoethyl)phosphate, and monoperfluoroalkylethyl phosphate can be given.

As examples of commercially available products of the fluorine-containing surfactant, Megafac F142D, F172, F173, F183 (manufactured by Dainippon Ink and Chemicals, Inc.), Eftop EF301, EF303, EF352 (manufactured by Shin-Akita Kasei Co., Ltd.). Fluorad FC-430, FC-431 (manufactured by Sumitomo 3M, Ltd.), Asahi Guard AG710, Surflon S-382, SC-101, SC-102, SC-103, SC-104, SC-105, SC-106 (manufactured by Asahi Glass Co., Ltd.), BM-1000, BM-1100 (manufactured by BM Chemie), and NBX-15 (manufactured by NEOS Co., Ltd.) can be given. Of these, Megafac F172, BM-1000, BM-1100, and NBX-15 are particularly preferable.

As the silicone surfactant, SH7PA, SH21PA, SH28PA, SH30PA, ST94PA (manufactured by Toray-Dow Corning Silicone Co., Ltd.), and the like may be used. Of these, SH28PA and SH30PA are particularly preferable.

The surfactant is used in an amount of usually 0.00001 to 1 part by weight for 100 parts by weight of the component (B).

The surfactant may be used either individually or in combination of two or more.

2.3 Method of Forming Polycarbosilane Insulating Film

The polycarbosilane insulating film may be formed by applying the composition 2 to the polysiloxane insulating film described in 1.3, removing the solvent, and curing the resulting coating by heating. As the method for applying the composition 2, a spin coating method, a dipping method, a roller blade method, a spray method, a scan coating method, and a slit-die coating method can be given.

The thickness of the polycarbosilane insulating film is adjusted to such an extent that the polysiloxane insulating film positioned under the polycarbosilane insulating film is not damaged due to plasma generated when forming a CVD insulating film by plasma CVD. The thickness (e.g. dry thickness) of the polycarbosilane insulating film is preferably 0.5 to 100 nm, and still more preferably 1 to 50 nm, taking damage to the polysiloxane insulating film into consideration. In order to form a polycarbosilane insulating film having a desired thickness, the viscosity of the composition 2 may be adjusted or the number of applications may be appropriately selected, for example.

It is preferable that heating for curing the coating be performed at a temperature suitable for the polycarbosilane compound be three-dimensionally crosslinked by polymerization. The heating is performed at preferably 150° C., and still more preferably about 200 to 600° C. The heating time is not particularly limited. The heating time is usually about 1 to 240 minutes. As the method for heating the coating, a hot plate, oven, furnace, or the like may be used. The coating may be heated in air, in nitrogen, in argon, under vacuum, or under reduced pressure in which the oxygen concentration is controlled. When curing the coating, electron beams or ultraviolet rays may be applied simultaneously with or separately from heating.

3. Method of Forming CVD Insulating Film

A CVD insulating film is formed on the polycarbosilane insulating film described in 2.3 by using the plasma CVD method. As examples of the CVD insulating film, Si-containing films such as $SiO_2$, SiN, SiC, SiCN, and SiOC can be given. In the plasma CVD method, a reaction gas is put in a low temperature plasma state and decomposed into chemically active ions and radicals to form a film. As the plasma CVD method, a generally used method may be used. As the plasma CVD method, a method using a high frequency and a method using a microwave can be given. The method using a high frequency is roughly divided into a capacitive coupling type and an inductive coupling type.

When using $SiO_2$ as the CVD insulating film, $SiH_4$—$N_2O$ gas, TEOS (tetraethoxysilane)-$O_2$ gas, or the like may be used as the reaction gas. When using SiN as the CVD insulating film, $SiH_4$—$N_2$ gas, $SiH_4$—$NH_3$ gas, or the like may be used as the reaction gas. As a carbon source gas, trimethylsilane, tetramethylsilane, dimethyldimethoxysilane, or the like may be used.

The CVD insulating film may be used as an interlayer dielectric or a passivation film for a semiconductor device, for example. There are no specific limitations to the thickness of the CVD insulating film. The thickness of the CVD insulating film may be selected depending on the application and function.

4. Insulating Film

An insulating film of the invention is obtained by the above-described method of forming an insulating film. Specifically, the insulating film of the invention is a multilayer insulating film in which at least the polycarbosilane insulating film, the polycarbosilane insulating film, and the CVD insulating film are layered. In the insulating film, since the polycarbosilane insulating film, which is rarely damaged by plasma, is provided between the polysiloxane insulating film (low-k film) and the CVD insulating film, the polysiloxane insulating film is not damaged by plasma. Therefore, the insulating film of the invention exhibits excellent resistance against processing such as etching, ashing, or wet cleaning while maintaining the low relative dielectric constant of the polysiloxane insulating film.

The insulating film of the invention is useful for applications such as an interlayer dielectric for semiconductor devices such as an LSI, system LSI, DRAM, SDRAM, RDRAM, and D-RDRAM, a protective film such as a surface coating film for semiconductor devices, an interlayer dielectric for multilayer interconnect substrates, and a protective film and an insulating film for liquid crystal display elements.

5. Example

The invention is described below in more detail by way of examples. In the examples and comparative examples, "part" and "%" respectively indicate "part by weight" and "wt %" unless otherwise indicated. The following description generally represents aspects of the invention, and should not be construed as limiting the invention.

5.1 Preparation of Polycarbosilane Solution 5.1.1 Preparation Example 1

Polycarbosilane ("NIPUSI Type-S" available from Nippon Carbon Co., Ltd.; carbosilane polymer of polydimethylsilane) was dissolved in a mixed solution of propylene glycol monopropyl ether and cyclohexanone (weight ratio: propylene glycol monopropyl ether:cyclohexanone=50:50) so that the solid content was 2% to obtain a film-forming composition (A).

5.1.2 Preparation Example 2

Polyallyldihydrocarbosilane ("SP-10" available from Starfire; carbosilane polymer of polydimethylsilane) was dissolved in a mixed solution of propylene glycol monopropyl ether and 2-heptanone (weight ratio: propylene glycol monopropyl ether:2-heptanone=50:50) so that the solid content was 2% to obtain a film-forming composition (B).

5.2 Formation of Insulating Film 5.2.1 Example 1

A polysiloxane compound was obtained by the following method. A separable flask made of quartz was charged with 570 g of distilled ethanol, 160 g of ion-exchanged water, and 30 g of a 10% tetramethylammonium hydroxide aqueous solution. The mixture was then uniformly stirred. A mixture of 136 g of methyltrimethoxysilane and 209 g of tetraethoxysilane was added to the solution. The mixture was then allowed to react at 55° C. for two hours. After the addition of 300 g of propylene glycol monopropyl ether to the solution, the mixture was concentrated at 50° C. by using an evaporator until the solid content was 10% (converted into complete hydrolysis-condensation product). Then, 10 g of a 10% propylene glycol monopropyl ether solution of acetic acid was added to obtain a coating liquid. The coating liquid was filtered through a Teflon (registered trademark) filter with a pore size of 0.2 µm to obtain a polysiloxane compound film-forming composition (C).

The film-forming composition (C) was applied to an 8-inch silicon wafer by spin coating and sintered at 400° C. to obtain a polysiloxane insulating film (low-k film) (thickness: 400 nm, dielectric constant: 2.3).

The film-forming composition (A) was applied to the polysiloxane insulating film by spin coating, dried at 80° C. for one minute and at 200° C. for one minute, and cured at 350° C. for three minutes in a nitrogen atmosphere to form a polycarbosilane insulating film (protective layer) (thickness: 10 nm).

A plasma TEOS film (p-TEOS) or a silicon nitride film (PEN) with a thickness of 300 nm was formed on the polycarbosilane insulating film by using a plasma CVD deposition system manufactured by Applied Materials Inc.

An insulating film of Example 1 (laminate of three layers of insulating films) was obtained in this manner. As an example in which plasma CVD deposition was not performed, an insulating film was prepared without forming the p-TEOS or PEN.

5.2.2 Example 2

The film-forming composition (C) obtained in Example 1 was applied to an 8-inch silicon wafer by spin coating and dried at 80° C. for one minute and at 200° C. for one minute to obtain an uncured polysiloxane insulating film (thickness: 400 nm).

The film-forming composition (A) was applied to the uncured polysiloxane insulating film by spin coating, dried at 80° C. for one minute and at 200° C. for one minute, and cured at 350° C. for three minutes in a nitrogen atmosphere to form a polycarbosilane insulating film (protective layer) (thickness: 10 nm).

A plasma TEOS film (p-TEOS) or a silicon nitride film (PEN) with a thickness of 300 nm was formed on the polycarbosilane insulating film by using a plasma CVD deposition system manufactured by Applied Materials Inc.

An insulating film of Example 2 (laminate of three layers of insulating films) was obtained in this manner. As an example in which plasma CVD deposition was not performed, an insulating film was prepared without forming the p-TEOS or PEN.

5.2.3 Example 3

The film-forming composition (C) obtained in Example 1 was applied to an 8-inch silicon wafer by spin coating and dried at 80° C. for one minute and at 200° C. for one minute to obtain an uncured polysiloxane insulating film (thickness: 400 nm).

The film-forming composition (B) was applied to the uncured polysiloxane insulating film by spin coating, dried at 80° C. for one minute and at 200° C. for one minute, and cured at 350° C. for three minutes in a nitrogen atmosphere to form a polycarbosilane insulating film (protective layer) (thickness: 10 nm).

A plasma TEOS film (p-TEOS) or a silicon nitride film (PEN) with a thickness of 300 nm was formed on the polycarbosilane insulating film by using a plasma CVD deposition system manufactured by Applied Materials Inc.

An insulating film of Example 3 (laminate of three layers of insulating films) was obtained in this manner. As an example in which the plasma CVD deposition was not performed, an insulating film was prepared without forming the p-TEOS or PEN.

5.2.4 Comparative Example 1

The film-forming composition (C) obtained in Example 1 was applied to an 8-inch silicon wafer by spin coating and sintered at 400° C. to obtain a polysiloxane insulating film (thickness: 400 nm, dielectric constant: 2.3).

A plasma TEOS film (p-TEOS) or a silicon nitride film (PEN) with a thickness of 300 nm was formed on the polysiloxane insulating film by using a plasma CVD deposition system manufactured by Applied Materials Inc.

In the comparative example, two insulating films were obtained without forming a polycarbosilane insulating film as a protective layer. As an example in which plasma CVD deposition was not performed, an insulating film was prepared without forming the p-TEOS or PEN.

5.3 Evaluation of Insulating Film 5.3.1 Measurement of Relative Dielectric Constant A relative dielectric constant measurement sample was prepared by forming an aluminum electrode pattern on the resulting insulating film by using a deposition method. The relative dielectric constant of each sample was measured by a CV method at a frequency of 100 kHz using an electrode "HP16451B" and a precision LCR meter "HP4284A" manufactured by Yokogawa-Hewlett-Packard, Ltd.

5.3.2 Evaluation of Film Thickness

The thickness of each layer of the insulating film (laminate) was calculated by using a multilayer analysis mode of "n&k analyzer 1500" manufactured by N&K technology Inc.

5.3.3 Relative Dielectric Constant of Polysiloxane Insulating Film

The relative dielectric constant of the polysiloxane insulating film was calculated by using a series capacitor model from the measurement results for the thickness of each layer obtained by the multilayer analysis and the relative dielectric constant of the laminate, in which the dielectric constant of the p-TEOS film was set at 4.1 and the Dielectric Constant of the PEN Film was Set at 6.9.

5.3.4 Chemical Resistance (Process Resistance) of Film

The wafer laminates obtained in Examples 1 to 3 and Comparative Example 1 were cut to a size of 2×10 mm to prepare samples. Each sample was immersed in a 0.2% diluted hydrofluoric acid aqueous solution at room temperature for one minute. The fracture plane of the sample was observed by using an SEM to determine whether or not the polysiloxane insulating film was etched by the diluted hydrofluoric acid.

TABLE 1

|  | CVD insulating film | Relative dielectric constant of polysiloxane insulating film | Etching |
| --- | --- | --- | --- |
| Example 1 | TEOS | 2.29 | None |
| Example 1 | PEN | 2.3 | None |
| Example 1 | None | 2.29 | None |
| Example 2 | TEOS | 2.3 | None |
| Example 2 | PEN | 2.33 | None |
| Example 2 | None | 2.3 | None |
| Example 3 | TEOS | 2.34 | None |
| Example 3 | PEN | 2.37 | None |
| Example 3 | None | 2.32 | None |
| Comparative Example 1 | TEOS | 2.54 | Etched |
| Comparative Example 1 | PEN | 2.76 | Etched |
| Comparative Example 1 | None | 2.27 | None |

In the insulating films of Examples 1 to 3, the polycarbosilane insulating film is formed on the polysiloxane insulating film, and the polycarbosilane insulating film functions as a protective layer for the polysiloxane insulating film. Therefore, in the insulating films of Examples 1 to 3, in which the polycarbosilane insulating film was formed on the polysiloxane insulating film, an increase in the relative dielectric constant and occurrence of etching due to the hydrofluoric acid were not observed. Therefore, according to the insulating films of Examples 1 to 3, it was confirmed that plasma damage occurring when forming the plasma CVD film on the polysiloxane insulating film can be reduced.

On the other hand, the polycarbosilane insulating film is not formed in the insulating film of Comparative Example 1. As shown in Table 1, it was confirmed that damage due to etching occurs and the relative dielectric constant is increased in the insulating film of Comparative Example 1.

Although only some embodiments of the present invention have been described in detail above, those skilled in the art will readily appreciate that many modifications are possible in the embodiments without materially departing from the novel teachings and advantages of this invention. Accordingly, all such modifications are intended to be included within scope of this invention.

What is claimed is:

1. A method of forming an insulating film, the method comprising:
    forming a polysiloxane insulating film on a substrate;
    forming a polycarbosilane insulating film on the polysiloxane insulating film; and
    forming a CVD insulating film on the polycarbosilane insulating film by plasma chemical vapor deposition (CVD);
    wherein the polysiloxane insulating film is formed by hydrolysis and condensation of at least one silane compound selected from the group consisting of compounds shown by the following general formulas (1) to (3), $$R_a Si(OR^1)_{4-a} \quad (1)$$

wherein R represents a hydrogen atom, a fluorine atom, or a monovalent organic group, $R^1$ represents a monovalent organic group, and a represents 1 or 2, $$Si(OR^2)_4 \quad (2)$$

wherein $R^2$ represents a monovalent organic group, $$R^3{}_b(R^4O)_{3-b}Si-(R^7)_d-Si(OR^5)_{3-c}R^6{}_c \quad (3)$$

wherein $R^3$ to $R^6$ individually represent monovalent organic groups, b and c individually represent integers from 0 to 2, $R^7$ represents an oxygen atom, a phenylene group, or a group $-(CH_2)_m-$ (wherein m represents an integer from 1 to 6), and d represents 0 or 1; and wherein the polycarbosilane insulating film is formed by applying a solution obtained by dissolving a polycarbosilane compound shown by the following general formula (4) in a solvent, and heating the resulting coating,

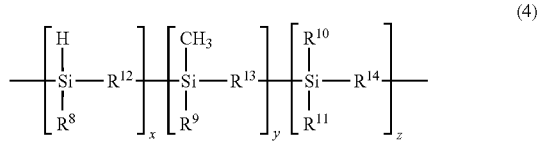

(4)

wherein $R^8$ to $R^{11}$ individually represent a hydrogen atom, a halogen atom, a hydroxyl group, alkoxyl group, sulfone group, methanesulfone group, trifluoromethanesulfone group, or monovalent organic group, $R^{12}$ to $R^{14}$ individually represent a substituted or unsubstituted alkylene group, alkenyl group, alkynyl group, or arylene group, and x, y, and z represent integers from 0 to 10,000, provided that x, y, and z satisfy a condition of "10<x+y+z<10,000".

2. The method of forming an insulating film according to claim 1,
wherein, in the formation step of the polycarbosilane insulating film, the coating is heated at 80° C. or higher.

3. The method of forming an insulating film according to claim 1,
wherein the CVD insulating film is an Si-containing film such as $SiO_2$, SiN, SiC, SiCN, or SiOC.

4. An insulating film, comprising:
a polysiloxane insulating film formed on a substrate;
a polycarbosilane insulating film formed on the polysiloxane insulating film; and
a CVD insulating film formed on the polycarbosilane insulating film by plasma CVD;
wherein the polysiloxane insulating film is formed by hydrolysis and condensation of at least one silane compound selected from the group consisting of compounds shown by the following general formulas (1) to (3), $$R_a Si(OR^1)_{4-a} \quad (1)$$

wherein R represents a hydrogen atom, a fluorine atom, or a monovalent organic group, $R^1$ represents a monovalent organic group, and a represents 1 or 2, $$Si(OR^2)_4 \quad (2)$$

wherein $R^2$ represents a monovalent organic group, $$R^3{}_b(R^4O)_{3-b}Si-(R^7)_d-Si(OR^5)_{3-c}R^6{}_c \quad (3)$$

wherein $R^3$ to $R^6$ individually represent monovalent organic groups, b and c individually represent integers from 0 to 2, $R^7$ represents an oxygen atom, a phenylene group, or a group $-(CH_2)_m-$ (wherein m represents an integer from 1 to 6), and d represents 0 or 1; and wherein the polycarbosilane insulating film is formed by applying a solution obtained by dissolving a polycarbosilane compound shown by the following general formula (4) in a solvent, and heating the resulting coating,

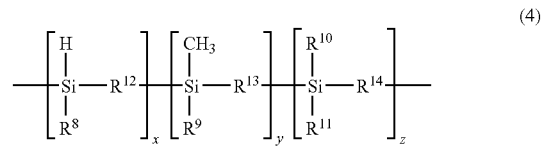

(4)

wherein $R^8$ to $R^{11}$ individually represent a hydrogen atom, a halogen atom, a hydroxyl group, alkoxyl group, sulfone group, methanesulfone group, trifluoromethanesulfone group, or monovalent organic group, $R^{12}$ to $R^{14}$ individually represent a substituted or unsubstituted alkylene group, alkenyl group, alkynyl group, or arylene group, and x, y, and z represent integers from 0 to 10,000, provided that x, y, and z satisfy a condition of "10<x+y+z<10,000".

5. The insulating film according to claim 4,
wherein the CVD insulating film is an Si-containing film such as $SiO_2$, SiN, SiC, SiCN, or SiOC.

* * * * *